United States Patent [19]

Sroog

[11] Patent Number: 4,687,611

[45] Date of Patent: Aug. 18, 1987

[54] PROCESS FOR DRYING POLYIMIDE FILM

[75] Inventor: Cyrus E. Sroog, Wilmington, Del.

[73] Assignee: E. I. Du Pont de Nemours and Company, Wilmington, Del.

[21] Appl. No.: 812,718

[22] Filed: Dec. 23, 1985

[51] Int. Cl.$^4$ .................. B29C 39/14; B29D 7/00; B29D 7/01

[52] U.S. Cl. .................. 264/236; 264/204; 264/331.21; 264/344; 264/345; 264/347; 524/296; 524/297; 524/845; 525/420

[58] Field of Search .................. 264/204, 216, 235.6, 264/331.21, 345, 347, 344, 236; 524/296, 297, 845; 525/420

[56] References Cited

U.S. PATENT DOCUMENTS

| | | | |
|---|---|---|---|
| 3,247,165 | 4/1966 | Rodia | 264/216 X |
| 3,316,654 | 5/1967 | Gay | 264/345 X |
| 3,502,762 | 3/1970 | Haller | 264/204 |
| 3,541,036 | 11/1970 | Libackyj. | |
| 3,600,361 | 8/1971 | Heacock et al. | 264/216 X |
| 3,619,461 | 11/1971 | Gay. | |
| 3,691,136 | 9/1972 | Serres et al. | |
| 3,778,417 | 12/1973 | Serres et al. | |
| 4,324,836 | 4/1982 | Patton | 428/336 |
| 4,330,453 | 5/1982 | Patton | 524/294 |

FOREIGN PATENT DOCUMENTS 60-190314  9/1985  Japan .................. 264/345

*Primary Examiner*—Jeffery Thurlow
*Assistant Examiner*—Leo B. Tentoni

[57] ABSTRACT

Polyimide film prepared from a precursor solutions of polyamic acid in a solvent can be dried during or following the thermal or chemical conversion step, which produces a polyimide, by adding to the solution a small amount of an alkyl ester of phthalic, terephthalic, or isophthalic acid, casting the solution on a flat surface and heating the solution on the flat surface at about 100°–200° C.; then, removing the resulting partially converted film from the flat surface and heating it, under restraint, to about 200°–375° C., to bring about complete conversion and remove virtually all of the solvent. Polyimide films are useful in various applications where high temperature resistance is required, including composites for aerospace applications and for circuit boards for electronic equipment.

13 Claims, No Drawings

PROCESS FOR DRYING POLYIMIDE FILM

FIELD OF THE INVENTION

This invention relates to an improved process for removing solvent from cast polyimide film, thus improving the film's drying rate and saving drying energy.

BACKGROUND OF THE INVENTION

Polyimide films are well known in the art. Chemically, such films are composed of a polymer having the recurring unit (1)

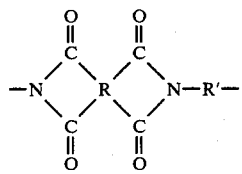

wherein:
R is an organic tetravalent radical containing at least two carbon atoms, no more than two carbonyl groups being attached to any one carbon atom of R; and
R' is a divalent radical containing at least two carbon atoms, each one of the two valencies of R' being on a separate carbon atom.

Various polyimides and their methods of manufacture are described, among others, in the following U.S. Pat. Nos.: 3,179,614 (Edwards); 3,179,634 (Edwards); 3,179,633 (Endrey); and 3,316,212 (Angelo et al.).

The polyimide normally is made by dehydrating and cyclizing a precursor polyamic acid, for example, as shown below:

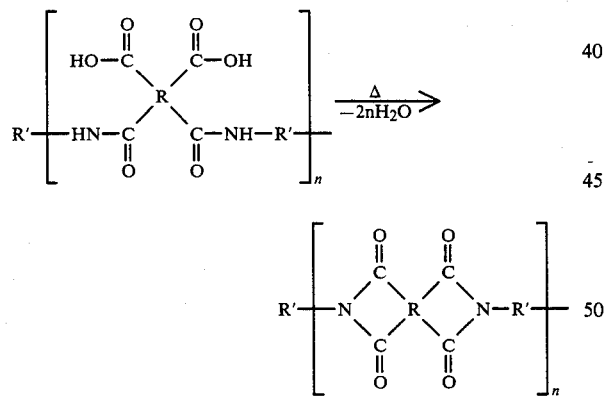

where n is a whole number.

The precursor polyamic acid is normally made from a dianhydride of a tetracarboxylic acid, e.g., pyromellitic acid, and a diamine, e.g., 4,4'-diaminodiphenyl ether, by simple condensation at room or lower temperature in a solvent in which both the starting materials and the resulting polyamic acid are soluble, for example, N,N-dimethylacetamide (sometimes hereinafter abbreviated to DMAC). In order to obtain a polyimide film, the precursor solution according to one technique is cast on a substrate, such as a metal or glass plate, and heated to a sufficiently high temperature to remove substantially all of the solvent, and to cause water elimination and cyclization, as shown in the above equation, e.g., 300°–360° C. See, for example, the above cited U.S. patents. This is known as thermal conversion of polyamic acid to polyimide. According to another technique, known as chemical conversion, dehydrating chemicals such as a combination of acetic anhydride and pyridine are first added to the polyamic solution before casting. This permits conversion of polyamic acid to polyimide at a lower temperature or, alternatively, in a shorter time. Depending on the particular polyimide, the solvent, the film thickness, and the temperature, some solvent may be retained in the polyimide film whichever technique is used. In the case of certain commercial polyimide films which are used in such applications as circuit boards for computers and in similarly sensitive electronic equipment whose performance could be affected by anything more than trace amounts of the solvent, it is usually necessary to dry the film at a rather high temperature (about 360° C. or more) for a rather long time (often several minutes) in order to obtain a product of sufficiently high quality.

It would be desirable to be able to effect good solvent removal either at a lower temperature or within a shorter time or, even more so, to a higher degree of dryness.

SUMMARY OF THE INVENTION

According to the present invention, there is now provided an improvement in the process for casting a polyimide film from solution of precursor polyamic acid in an organic solvent, said improvement comprising adding to the polyamic acid solution from about 0.5 to about 5.0%, based on the weight of dissolved polyamic acid, of an ester of a phthalic acid,

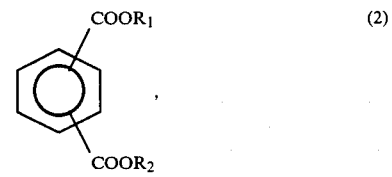

wherein each one of $R_1$ and $R_2$ independently is an alkyl of 1 to 8 carbon atoms, casting the solution on a suitable flat substrate, and heating the substrate containing a layer of the solution thereon to a temperature of about 100 to 200° C. to remove a major portion of the organic solvent and to effect a partial conversion to polyimide and then removing the resulting partially converted film from the substrate and further heating it, under restraint, to about 200° to 375° C. for a sufficient time to effect complete conversion to polyimide and virtually complete removal of the organic solvent.

DETAILED DESCRIPTION OF THE INVENTION

Any polyimide film which can be cast from a precursor polyamic acid solution and converted by heating can be handled according to the improved process of this invention. While the R portion of the polyimide normally will be derived from pyromellitic dianhydride, it can also be derived from other tetracarboxylic dianhydrides, e.g., benzophenonetetracarboxylic dianhydride, isopropylidenebis(benzene-3,4-dicarboxylic) dianhydride, or 3,3',4,4'-diphenyltetracarboxylic dianhydride. The diamine can be, for example, 4,4'-methylenebisdianiline, 4,4'-oxydianiline, p- phenylenediamine, chloro-p-phenylenediamine, m-phenylenediamine; and 4,4'-sulfonedianiline. Various suitable diamines and dianhydrides are described in the U.S. patents cited in the introductory portion of this disclosure, which are incorporated herein by reference.

Typical esters of formula (2) (phthalic esters) which can be used in this improved process include, for example, dimethyl, diethyl, dibutyl, diisobutyl, dioctyl, methylethyl, and ethylhexyl esters of all three isomeric phthalic acids, that is, phthalic acid, isophthalic acid, and terephthalic acid. The preferred esters are dimethyl phthalate and dimethyl terephthalate. The preferred amount of the ester is within the range of 1 to 5 weight % of the dissolved polyamic acid.

The polyamic acid solvent normally used in this process will be DMAC; however, other solvents can be used, e.g.: N-methylpyrrolidone, dimethyl sulfone, tetramethylene sulfone, and dimethylformamide. Normally, the boiling point of such solvent at room temperature should not be more than about 250° C.

The preferred maximum temperature range at which complete polymer conversion takes place is about 350° to 360° C. The temperature depends to some extent on the thickness of the layer of the initial precursor solution, the chemical identity of the precursor, and the solvent used. Following the partial conversion of the polyamic acid, the resulting film is placed under restraint, e.g., on a tenter frame, and heated to the full conversion temperature. It is preferred to operate under such conditions that the maximum temperature is maintained no longer than about 2 min., while the total heating time of both the partial conversion and the full conversion steps is no longer than 60 min. The above temperatures and times apply to both thermal and chemical conversions, although the first, lower temperature, heating step may achieve its objective in a shorter time in the case of chemical conversions.

The process of this invention can be carried out in any suitable manner. Preferably, the phthalic ester is added as a solid or a melt to the polyamic acid solution. The polyamic acid solution normally contains about 10 to 20 wt. % solids (polyamic acid) and thus has a suitable consistency for being applied by doctoring, extruding through a slit die, or otherwise onto a substrate. Such operations are well known to those skilled in the art.

The amount of residual solvent is determined by thermogravimetry combined with mass spectrometry. The phthalic ester in the solution is determined by gas chromatography. However, the amount of residual phthalic ester in the film could not be determined with sufficient accuracy, except that in most determinations no significant differences were found between samples containing nominal amounts of phthalic ester according to this invention and control samples to which no phthalic ester had been added.

This invention is now illustrated by the following examples of certain preferred embodiments thereof, where all parts, proportions, and percentages are by weight, unless otherwise indicated. Phthalic ester concentrations given in Examples 1-3 are expressed as percent of solids (i.e., of polyamic acid), not as percent of the weight of the solution.

EXAMPLE 1

Residual DMAC in Polyimide Film Prepared by Thermal Conversion

To 19% solution in DMAC of polyamic acid prepared from pyromellitic dianhydride and 4,4'-oxydianiline there was added dimethyl phthalate (DMP) in amounts shown below in Table I. The solution was placed in a 500 mL resin kettle and stirred under nitrogen for 30 minutes while cooled externally in a wet ice bath. The ice bath was then removed, and the solution was allowed to warm to room temperature and stirred for 30 more minutes. Film was cast by doctoring onto a glass plate, which was then heated in an air oven for 30 minutes at 100° C. The coalesced gel film was placed on a frame and heated successively at 200° C. for 5 minutes, 300° for 1 minute, and then at 360° C. for 1 minute. Table I shows the levels of residual DMAC in polyimide film both for control samples without DMP and for test samples in the presence of varying amounts of DMP.

TABLE I

| Run | % DMP | Film Thickness, mm | % Residual DMAC |
| --- | --- | --- | --- |
| A | — | 0.053 | 0.43 |
| B | 5 | 0.048 | 0.035 |
| C | — | 0.041 | 0.37 |
| D | 5 | 0.038 | 0.045 |
| E | 5 | 0.038 | 0.045 |

As can be seen from Table I, for the film exposed to a maximum temperature of 360° C., the amount of residual DMAC in the control run A was about 12 times higher than in run B, in which 5% of DMP was present. Similarly, the residual DMAC in control run C was about 8 times higher than in runs D and E.

EXAMPLE 2

Residual DMAC in Polyimide Film Prepared by Chemical Conversion

DMP was added in one run directly to the same polyamic acid solution as that used in Example 1, and it dissolved without difficulty. Dimethyl terephthalate (DMT) is much less soluble in DMAC and, when it was added in another run to the same polyamic acid solution, the mixture was stirred for about 2 hours, at 40-50° C. until DMT dissolved completely. In each case, to a 500 mL resin kettle equipped with an air-driven polytetrafluoroethylene-coated stirrer, there were added, under nitrogen blanket, 100 g of a polyamic acid solution containing the alkyl phthalate, 13 g of DMAC dried over molecular sieves, and 18.4 g of acetic anhydride. The materials were mixed for 30 min. with external cooling with wet ice. The ice bath was then removed and replaced with a dry-ice/acetone bath; the solution in the resin kettle was cooled to −20° C. A solution of 10.63 g of pyridine in 20 g of DMAC was added dropwise with stirring over a period of 45 minutes. The cooling bath was removed, and the resin kettle was evacuated at a reduced pressure (33.2 kPa) until the temperature of the contents rose to 0° C. Film was cast by doctoring onto a glass plate, which then was heated 8 min. at 100° C. The resulting gel film was placed onto a frame and heated in succession at 200° C. for 3 min., at 300° C. for 1 min., and at 360° C. for 1 min. The experimental data are presented in Table II, below:

TABLE II

| Run | Additive (%) | Thickness (mm) | Residual DMAC (%) |
|---|---|---|---|
| A | — | 0.033 | 1.00 |
| B | DMT(5) | 0.036 | 0.08 |
| C | DMP(5) | 0.028 | 0.08 |

Here again, it can be seen that addition of a dimethyl phthalate decreases the amount of residual DMAC by over 90%.

EXAMPLE 3

Various alkyl phthalates were tested as additives, according to the technique described in Example 1. The results of residual DMAC determinations made for duplicate runs after exposure to a maximum temperature of 360° C. are shown in Table III, below.

TABLE III

| Test | Composition | Wt. % DMAC Run 1 | Wt. % DMAC Run 2 | Film Thickness(mm) |
|---|---|---|---|---|
| A | Control | 2.46 | 2.02 | 0.081 |
| B | 1.25% diethyl phthalate | 0.093 | 0.35 | 0.046 |
| C | 1.25% dioctyl phthalate | 0.10 | 0.12 | 0.043 |
| D | 5.0% dioctyl phthalate | 0.33 | 0.27 | 0.066 |
| E | 5% diethyl phthalate | 0.15 | 0.30 | 0.043 |
| F | 5% dimethyl phthalate | 0.44 | 0.41 | 0.061 |
| G | 1.25% dimethyl phthalate | 0.46 | 0.35 | 0.051 |

It can be seen that after exposure to a maximum of 360° C., the amount of residual DMAC was very low in all the cases where a dialkyl phthalate was present.

EXAMPLE 4

In order to determine whether any residual phthalic ester in polyimide film had adverse effect on the electrical properties of the film, several runs were made with varying amounts of a number of different phthalic esters. The following electrical properties were determined in each case: dissipation constant, K; the dielectric constant, D; and the volume resistivity, $\rho$. The measurements were made according to ASTM procedures D150, D150, and D257, respectively.

The results of those tests are given in Table IV, wherein "% phthalic ester in film" means nominal concentration prior to heating, which is the same as the phthalic ester concentration in the initial solution, based on polyamic acid.

"Maximum heat exposure" is expressed as the highest temperature reached and the time during which that temperature was maintained.

TABLE IV

ELECTRICAL PROPERTIES OF POLYIMIDE FILMS CONTAINING PHTHALATE ADDITIVES

| Run | % Phthalic ester in Film | Maximum Heat Exposure | K ($10^3$ Hz) | D ($10^3$ Hz) | $\rho$ (ohm-cm) |
|---|---|---|---|---|---|
| A | — | 200° C./3 min | 4.26 | 0.0025 | $3.65 \times 10^{16}$ |
| B | 5% DMP[a] | 200° C./3 min | 7.01 | 0.007 | $5.09 \times 10^{16}$ |
| C | 2.5% DMT[b] | 200° C./3 min | 6.86 | 0.002 | $2.54 \times 10^{16}$ |
| D | 5% DMT | 300° C./1 min | 7.51 | 0.007 | $2.02 \times 10^{14}$ |
| E | 5% DMP | 300° C./1 min | 5.78 | 0.0023 | $1.38 \times 10^{16}$ |
| F | 5% DMP | 300° C./1 min | 4.70 | 0.0022 | $1.48 \times 10^{15}$ |
| G | 5% DMP | 360° C./1 min | 5.40 | 0.0023 | $3.20 \times 10^{16}$ |
| H | 5% DMT | 400° C./1 min | 3.82 | 0.0021 | $2.90 \times 10^{16}$ |
| I | 2.5% DMP | 360° C./1 min | 4.47 | 0.0023 | — |
| J | 20% DMP | 360° C./1 min | 4.30 | 0.0035 | $1.28 \times 10^{16}$ |
| K | 20% DMP | 300° C./1 min | 5.15 | 0.004 | $3.16 \times 10^{15}$ |
| L | 20% DMI[c] | 360° C./1 min | 4.30 | 0.0035 | $2.16 \times 10^{16}$ |
| M | — | 360° C./1 min | 4.62 | 0.0012 | $5.48 \times 10^{16}$ |
| N | 20% DOP[d] | 300° C./1 min | 3.53 | 0.0360 | $9.73 \times 10^{15}$ |

[a] dimethyl phthalate
[b] dimethyl terephthalate
[c] dimethyl isophthalate
[d] dioctyl phthalate It can be seen from Table IV that the heating conditions can be adjusted to obtain electrical properties essentially similar to those of the control films, runs A and M. Obviously, as the molecular weight of the phthalate ester increases and its amount increases, it is more difficult to obtain satisfactory electrical properties (see, e.g., run N).

I claim:

1. In a process for casting a polyimide film from solution of precursor polyamic acid in an organic solvent, the improvement comprising adding to said polyamic acid solution about 0.5-5.0% based on the weight of dissolved polyamic acid of a phthalic ester,

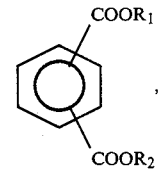

wherein each one of $R_1$ and $R_2$ independently is an alkyl of 1 to 8 carbon atoms,
casting the solution on a suitable flat substrate, and heating the substrate containing a layer of the solution thereon to a temperature of about 100° to 200° C. to remove a major portion of the organic solvent and to effect a partial conversion to polyimide, and then removing the resulting partially converted film from the substrate and further heating it, under restraint, to about 200° to 375° C. for a sufficient time to effect complete conversion to polyimide and virtually complete removal of the organic solvent.

2. The process of claim 1 wherein the organic solvent is N,N-dimethylacetamide.

3. The process of claim 2 wherein the precursor polyamic acid is a reaction product of pyromellitic dianhydride and 4,4'-oxydianiline.

4. The process of claim 1 wherein the phthalic ester is a dimethyl ester.

5. The process of claim 4 wherein the dimethyl ester is dimethyl phthalate, dimethyl isophthalate, or dimethyl terephthalate.

6. The process of claim 5 wherein the amount of the dimethyl ester is about 1 to 5% based on the weight of polyamic acid.

7. The process of claim 1 wherein the phthalic ester is diethyl phthalate or dioctyl phthalate.

8. The process of claim 7 wherein the amount of the phthalic ester is about 1 to 5% based on the weight of polyamic acid.

9. The process of claim 1 wherein the maximum temperature range at which complete polymer conversion takes place is about 350°–360° C.

10. The process of claim 1 wherein the total heating time of the partial conversion plus the full conversion steps is no longer than about 60 minutes.

11. The process of claim 10 wherein the maximum temperature is maintained no longer than about 2 minutes.

12. The process of claim 1 wherein the starting polyamic acid solution contains about 10 to 20 weight percent solids.

13. The process of claim 12 wherein the phthalic ester is added to the solution as a solid or a melt.

* * * * *